(12) United States Patent
Oh et al.

(10) Patent No.: US 11,502,158 B2
(45) Date of Patent: Nov. 15, 2022

(54) DISPLAY DEVICE INCLUDING FAN-OUT WIRING ARRANGED IN PERIPHERAL AREA ADJACENT TO DISPLAY AREA AND ALSO BEING DISPOSED IN SEALING AREA SURROUNDING DISPLAY AREA

(71) Applicant: Samsung Display Co., LTD., Yongin-si (KR)

(72) Inventors: Sang Hoon Oh, Seoul (KR); Yong Ho Yang, Suwon-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 146 days.

(21) Appl. No.: 17/132,648

(22) Filed: Dec. 23, 2020

(65) Prior Publication Data

US 2021/0265450 A1 Aug. 26, 2021

(30) Foreign Application Priority Data

Feb. 26, 2020 (KR) .......................... 10-2020-0023614

(51) Int. Cl.
*H01L 29/08* (2006.01)
*H01L 27/32* (2006.01)
*H01L 51/52* (2006.01)

(52) U.S. Cl.
CPC ...... *H01L 27/3276* (2013.01); *H01L 27/3265* (2013.01); *H01L 51/5243* (2013.01)

(58) Field of Classification Search
CPC ............. H01L 27/3276; H01L 27/3265; H01L 51/5243

USPC .......................................................... 257/40
See application file for complete search history.

(56) References Cited

U.S. PATENT DOCUMENTS

| 6,724,143 | B2 | 4/2004 | Chen et al. |
| 7,045,438 | B2 | 5/2006 | Yamazaki et al. |
| 8,378,569 | B2 | 2/2013 | Shin |
| 8,829,556 | B2 | 9/2014 | Aurongzeb et al. |
| 8,841,832 | B2 | 9/2014 | Shin |
| 8,853,676 | B2 | 10/2014 | Sun |
| 9,391,302 | B2 | 7/2016 | Cho et al. |
| 9,570,529 | B2 | 2/2017 | Lhee |
| 2019/0012031 | A1* | 1/2019 | Kim ...................... G06F 3/0412 |

(Continued)

FOREIGN PATENT DOCUMENTS

| KR | 10-2011-0072131 | 6/2011 |
| KR | 10-1265812 | 5/2013 |
| KR | 10-1276390 | 6/2013 |

*Primary Examiner* — Phuc T Dang
(74) *Attorney, Agent, or Firm* — Kile Park Reed & Houtteman PLLC

(57) ABSTRACT

A display device includes an array substrate including a pixel array disposed in a display area, and a fan-out wiring disposed in a peripheral area adjacent to the display area. The fan-out wiring is disposed in a sealing area surrounding the display area. The display device includes a cover substrate combined with the array substrate by a sealing member disposed in the sealing area. The fan-out wiring includes a first fan-out line, a second fan-out line, and a third fan-out line, which are disposed in different layers in a first peripheral area between the display area and the sealing area. The first fan-out line and the second fan-out line are disposed in a same layer in the sealing area, and the first fan-out line and the third fan-out line are disposed in different layers in the sealing area.

25 Claims, 10 Drawing Sheets

(56) References Cited

U.S. PATENT DOCUMENTS

2019/0348489 A1* 11/2019 Na ...................... H01L 27/3279
2020/0150503 A1* 5/2020 He ........................ G02F 1/1345

* cited by examiner

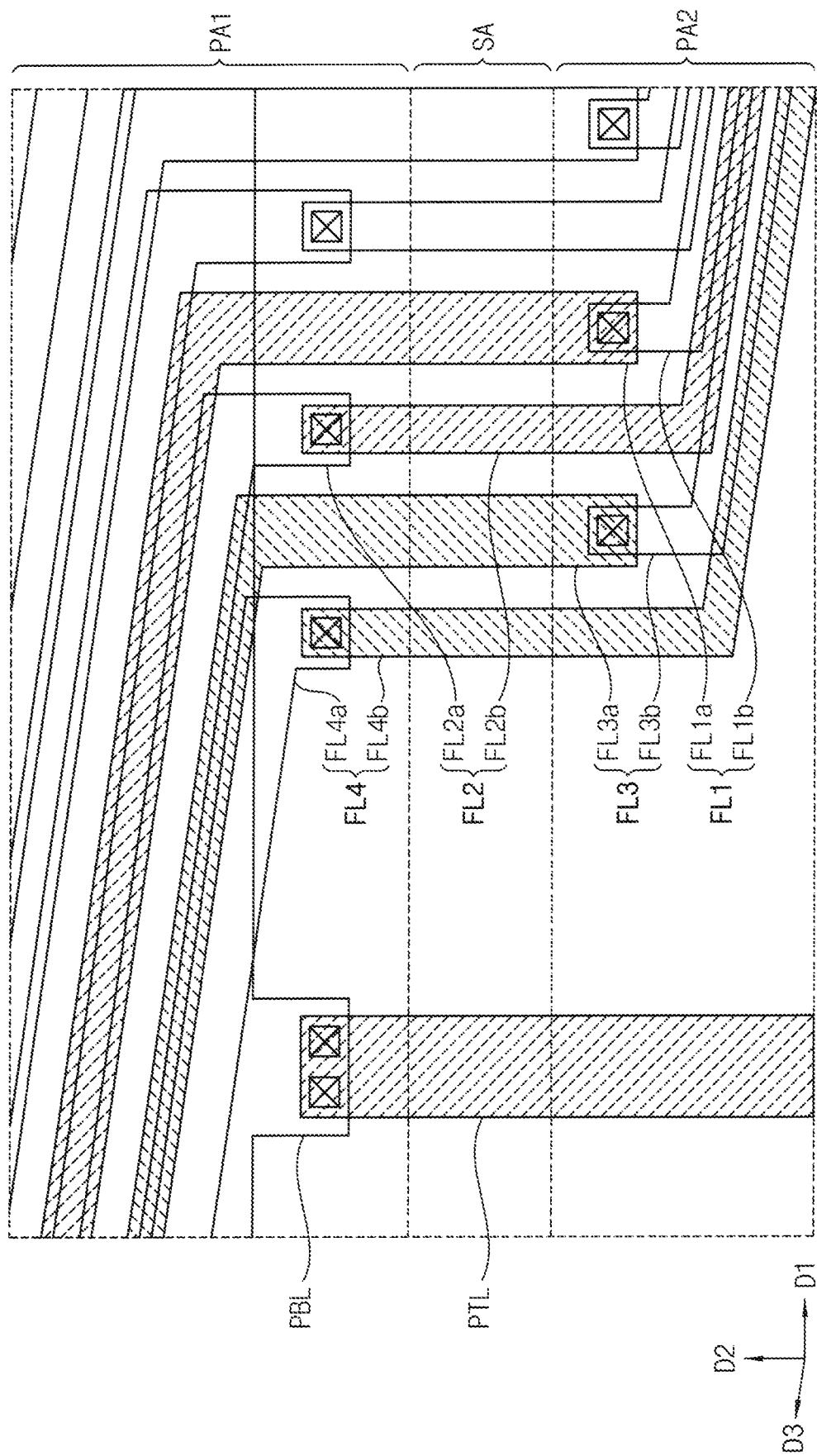

US 11,502,158 B2

DISPLAY DEVICE INCLUDING FAN-OUT WIRING ARRANGED IN PERIPHERAL AREA ADJACENT TO DISPLAY AREA AND ALSO BEING DISPOSED IN SEALING AREA SURROUNDING DISPLAY AREA

CROSS-REFERENCE TO RELATED APPLICATION(S)

This application claims priority to and benefits of Korean Patent Application No. 10-2020-0023614 under 35 U.S.C. § 119, filed in the Korean Intellectual Property Office on Feb. 26, 2020, the entire contents of which are incorporated herein by reference.

BACKGROUND

1. Technical Field

Embodiments relate to a display device including a sealing member.

2. Description of the Related Art

A display device may include a display panel and a driver providing a driving signal to the display panel. The driver may be included in a driving chip. The driving chip may be combined directly with a substrate of the display panel, or may be connected to a pad part through a flexible printed circuit board or the like.

The display panel may include a transfer wiring to transfer a signal or a power to a pixel array. In order to reduce a bezel of the display device, an area where the transfer wiring may be disposed may be preferably reduced.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

Embodiments may provide a display device having a reduced bezel and improved reliability.

According to an embodiment, a display device may include an array substrate including a pixel array disposed in a display area, and a fan-out wiring disposed in a peripheral area adjacent to the display area, the fan-out wiring being disposed in a sealing area surrounding the display area. The display device may include a cover substrate combined with the array substrate by a sealing member disposed in the sealing area. The fan-out wiring may include a first fan-out line, a second fan-out line and a third fan-out line, which are disposed in different layers in a first peripheral area between the display area and the sealing area. The first fan-out line and the second fan-out line may be disposed in a same layer in the sealing area, and the first fan-out line and the third fan-out line may be disposed in different layers in the sealing area.

In an embodiment, the second fan-out line may be disposed between the first fan-out line and the third fan-out line in the sealing area.

In an embodiment, the first fan-out line may include a first extension pattern and a second extension pattern. The first extension pattern may be disposed in the first peripheral area and the sealing area. The second extension pattern may be disposed in a second peripheral area spaced apart from the first peripheral area by the sealing area and electrically connected to the first extension pattern. The first extension pattern and the second extension pattern may be disposed in different layers.

In an embodiment, the second fan-out line may include a first extension pattern disposed in the first peripheral area, and a second extension pattern disposed in the sealing area and the second peripheral area. The second extension pattern may be electrically connected to the first extension pattern of the second fan-out line. The first extension pattern and the second extension pattern of the second fan-out line may be disposed in different layers.

In an embodiment, the third fan-out line may include a first extension pattern disposed in the first peripheral area, and a second extension pattern disposed in the sealing area and the second peripheral area. The second extension pattern may be electrically connected to the first extension pattern of the third fan-out line. The first extension pattern and the second extension pattern of the third fan-out line may be disposed in different layers.

In an embodiment, the second extension pattern of the first fan-out line, the second extension pattern of the third fan-out line, and the first extension pattern of the second fan-out line may be disposed in a same layer.

In an embodiment, the pixel array may include a first gate metal pattern including a gate electrode, a second gate metal pattern including a capacitor electrode pattern, and a first source metal pattern including a source electrode and a drain electrode. The first extension pattern of the first fan-out line and the first gate metal pattern may be disposed in a same layer. The first extension pattern of the second fan-out line and the first source metal pattern may be disposed in a same layer. The first extension pattern of the third fan-out line and the second gate metal pattern may be disposed in a same layer.

In an embodiment, the fan-out wiring may further include a fourth fan-out line. The fourth fan-out line may include a first extension pattern disposed in the first peripheral area, and a second extension pattern disposed in the sealing area and the second peripheral area. The second extension pattern may be electrically connected to the first extension pattern of the fourth fan-out line. The first extension pattern and the second extension pattern of the fourth fan-out line may be disposed in different layers.

In an embodiment, the second extension pattern of the second fan-out line and the first extension pattern of the first fan-out line may be disposed in a same layer. The second extension pattern of the fourth fan-out line and the first extension pattern of the third fan-out line may be disposed in a same layer.

In an embodiment, the second extension pattern of the second fan-out line may include a material having a melting point higher than a melting point of the first extension pattern of the second fan-out line.

In an embodiment, the first to third fan-out lines may include a conductive material having a melting point equal to or more than about 1,200° C., in the sealing area.

In an embodiment, the first to third fan-out lines may include molybdenum in the sealing area.

In an embodiment, adjacent fan-out lines may overlap each other in the first peripheral area, in a plan view.

In an embodiment, adjacent fan-out lines may be spaced apart from each other in the sealing area, in a plan view.

In an embodiment, the fan-out lines may be spaced apart from each other in a first direction in the sealing area, extend in a second direction perpendicular to the first direction in the sealing area, and extend in a third direction crossing the first direction and the second direction in the first peripheral area.

In an embodiment, adjacent fan-out lines may overlap each other in a second peripheral area spaced apart from the first peripheral area by the sealing area, in a plan view.

In an embodiment, the fan-out lines may extend in the third direction in the second peripheral area.

In an embodiment, the array substrate may further include a power bus line overlapping the first to third fan-out lines in the first peripheral area.

In an embodiment, the array substrate may further include a power transfer line electrically connected to the power bus line, and the power transfer line and one of the first fan-out line and the second fan-out line may be disposed in a same layer in the sealing area.

According to an embodiment, a display device may include a pixel array disposed in a display area, and a fan-out wiring disposed in a peripheral area adjacent to the display area and including fan-out lines. Each of the fan-out lines may include a first extension pattern disposed in a first peripheral area, and a second extension pattern disposed in a second peripheral area electrically connected to the first extension pattern. The first extension pattern and the second extension pattern may be disposed in different layers. A first extension pattern of a first fan-out line and a first extension pattern of a second fan-out line adjacent to the first fan-out line may be disposed in different layers. A first extension pattern of a third fan-out line adjacent to the second fan-out line, the first extension pattern of the first fan-out line, and the first extension pattern of the second fan-out line may be disposed in different layers.

The pixel array may include a first gate metal pattern including a gate electrode, a second gate metal pattern including a capacitor electrode pattern, and a first source metal pattern including a source electrode and a drain electrode. The first extension pattern of the first fan-out line and the first gate metal pattern may be disposed in a same layer. The first extension pattern of the second fan-out line and the first source metal pattern may be disposed in a same layer. The first extension pattern of the third fan-out line and the second gate metal pattern may be disposed in a same layer.

Adjacent fan-out lines may overlap each other in the first peripheral area, in a plan view.

Adjacent fan-out lines may overlap each other in the second peripheral area, in a plan view.

The first extension pattern of the first fan-out line, the second extension pattern of the second fan-out line, and the first extension pattern of the third fan-out line may extend into a sealing area between the first peripheral area and the second peripheral area, and include a conductive material having a melting point equal to or more than about 1,200° C.

The first extension pattern of the first fan-out line, the second extension pattern of the second fan-out line, and the first extension pattern of the third fan-out line may extend into a sealing area between the first peripheral area and the second peripheral area, and may include molybdenum.

According to embodiments, fan-out lines may be formed by at least three metal patterns disposed in different layers. Thus, a peripheral area where the fan-out lines may be disposed may be reduced.

Furthermore, a portion of the fan-out lines may be formed from a source metal pattern having a relatively great conductivity. Thus, a scan-on-time of a display device may be reduced, and a high-speed driving may be achieved.

Furthermore, extension patterns disposed in a sealing area may include a metal having a relatively high melting point. Thus, damage due to a laser sintering process may be prevented or reduced.

Furthermore, each of the fan-out lines may include extension patterns disposed in different layers and including different materials. Thus, resistance distribution due to resistance difference from material difference may be reduced.

BRIEF DESCRIPTION OF THE DRAWINGS

Aspects of one or more embodiments of the inventive concept will be more clearly understood from the following detailed description taken in conjunction with the accompanying drawings.

FIG. 14 is an enlarged schematic plan view illustrating a peripheral area of a display device according to an embodiment.

DETAILED DESCRIPTION OF THE EMBODIMENTS

Figure 1:
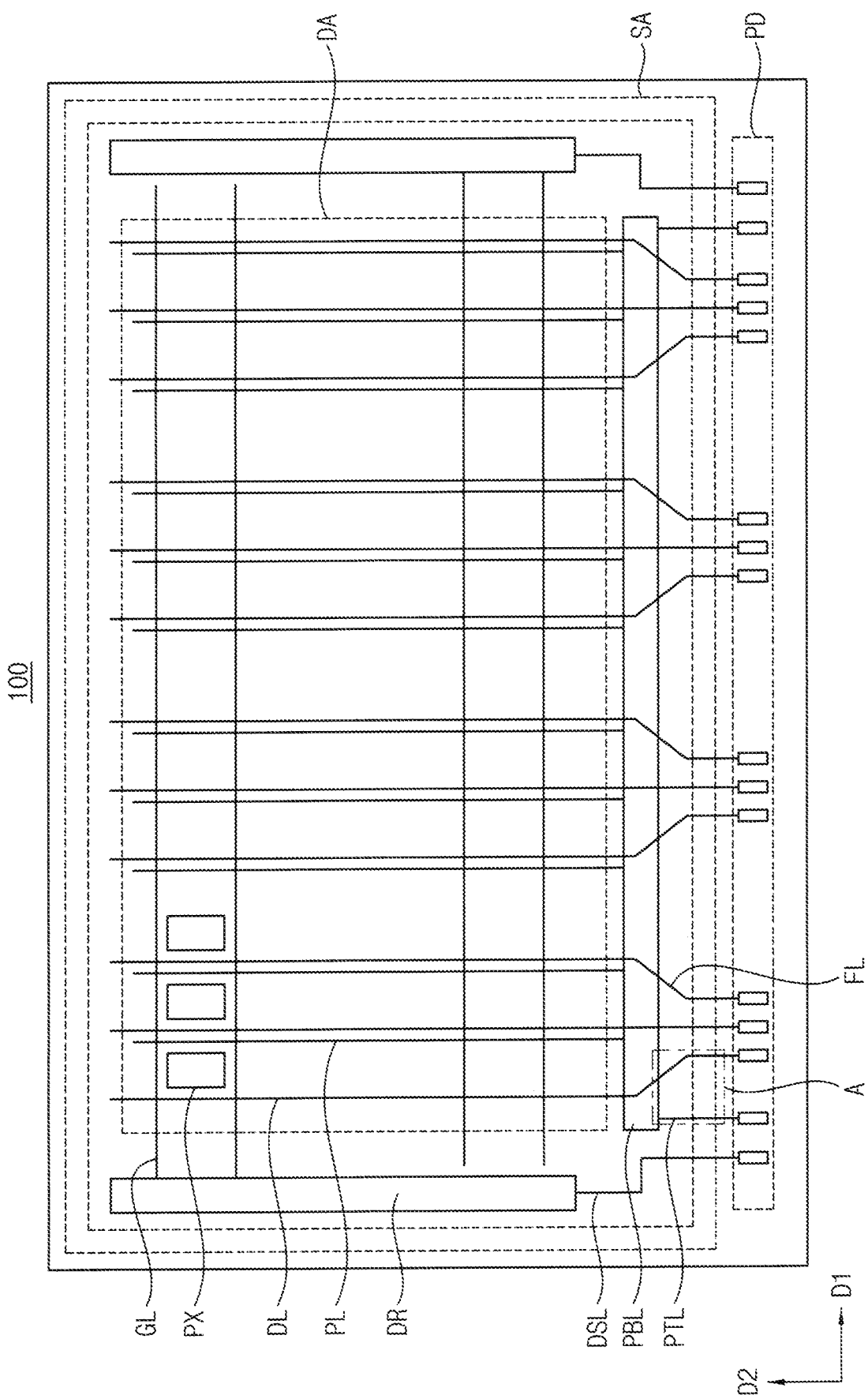
FIG. 1 is a schematic plan view illustrating an array substrate of a display device according to an embodiment.

A display device according to embodiments of the inventive concept will be described hereinafter with reference to the accompanying drawings, in which some embodiments are shown.

The singular forms "a," "an" and "the" are intended to include the plural forms as well, unless the context clearly indicates otherwise. The term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

In the drawings, the dimensions of elements may be exaggerated for clarity. The embodiments may not be limited to the dimensions shown.

Terms such as "comprises", "has", "have" and "includes" as used herein specify the presence of stated features or elements, but do not preclude the presence or addition of one or more other features or elements.

It will be understood that when an element (e.g., layer, region, etc.) is referred to as being disposed or otherwise "on" or "over" another element, it can be directly or indirectly on or over the other element. For example, intervening elements may be present.

The term "overlap" and variations thereof may include layer, stack, face or facing, extending over, extending under, covering or partly covering or any other suitable term as would be appreciated and understood by those of ordinary skill in the art.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 5% of the stated value.

Unless otherwise defined, all terms used herein (including technical and scientific terms) have the same meaning as commonly understood by those skilled in the art to which this disclosure pertains. It will be further understood that terms, such as those defined in commonly used dictionaries, should be interpreted as having a meaning that is consistent with their meaning in the context of the relevant art and will not be interpreted in an ideal or excessively formal sense unless clearly defined in the specification.

FIG. 1 is a schematic plan view illustrating an array substrate of a display device according to an embodiment.

Referring to FIG. 1, a display device according to an embodiment may include a display panel. The display panel may include an array substrate 100.

The array substrate 100 may include a display area DA and a peripheral area surrounding or adjacent to the display area DA. The display area DA may generate a light or may adjust transmittance of a light provided by an external light source to display an image. The peripheral area may be defined as an area that may display an image.

In an embodiment, the display panel may be an organic light-emitting display panel. For example, an array of pixels PX including a light-emitting element may be disposed in the display area DA to generate a light in response to a driving signal. A signal wiring and a power wiring may be disposed in the display area DA to transfer a driving signal and a power to the pixels PX. For example, a gate line GL, a data line DL and a power line PL may be disposed in the display area DA. The gate line GL may extend in a first direction D1 and may provide a gate signal to the pixels PX. The data line DL may extend in a second direction D2 crossing the first direction D1 and may provide a data signal to the pixels PX. The power line PL may extend in the second direction D2 and may provide a power to the pixels PX.

A transfer wiring, a circuit part or the like may be disposed in the peripheral area. The transfer wiring may transfer a driving signal or a power to the display area DA. The circuit part may generate a driving signal. For example, a driver DR generating a gate signal, a control signal wiring DSL transferring a control signal to the driver DR, a fan-out wiring FL transferring a data signal to the data line DL, a power bus line PBL transferring a power to the power line PL or the like may be disposed in the peripheral area.

In an embodiment, the peripheral area may include a sealing area SA in which a sealing member may be disposed. The sealing area SA may have a shape surrounding the display area DA.

The transfer wiring may extend to a side of the peripheral area to be electrically connected to a pad part PD. Connection pads disposed in the pad part PD may be electrically connected to a driving device. Thus, the transfer wiring may be electrically connected to the driving device to receive the driving signal, the control signal, the power or the like.

For example, the driving device may include a driving chip, a flexible printed circuit board with a driving chip mounted thereon, a printed circuit board with a controller mounted thereon to provide a control signal to a driving chip, or the like.

Figure 2:
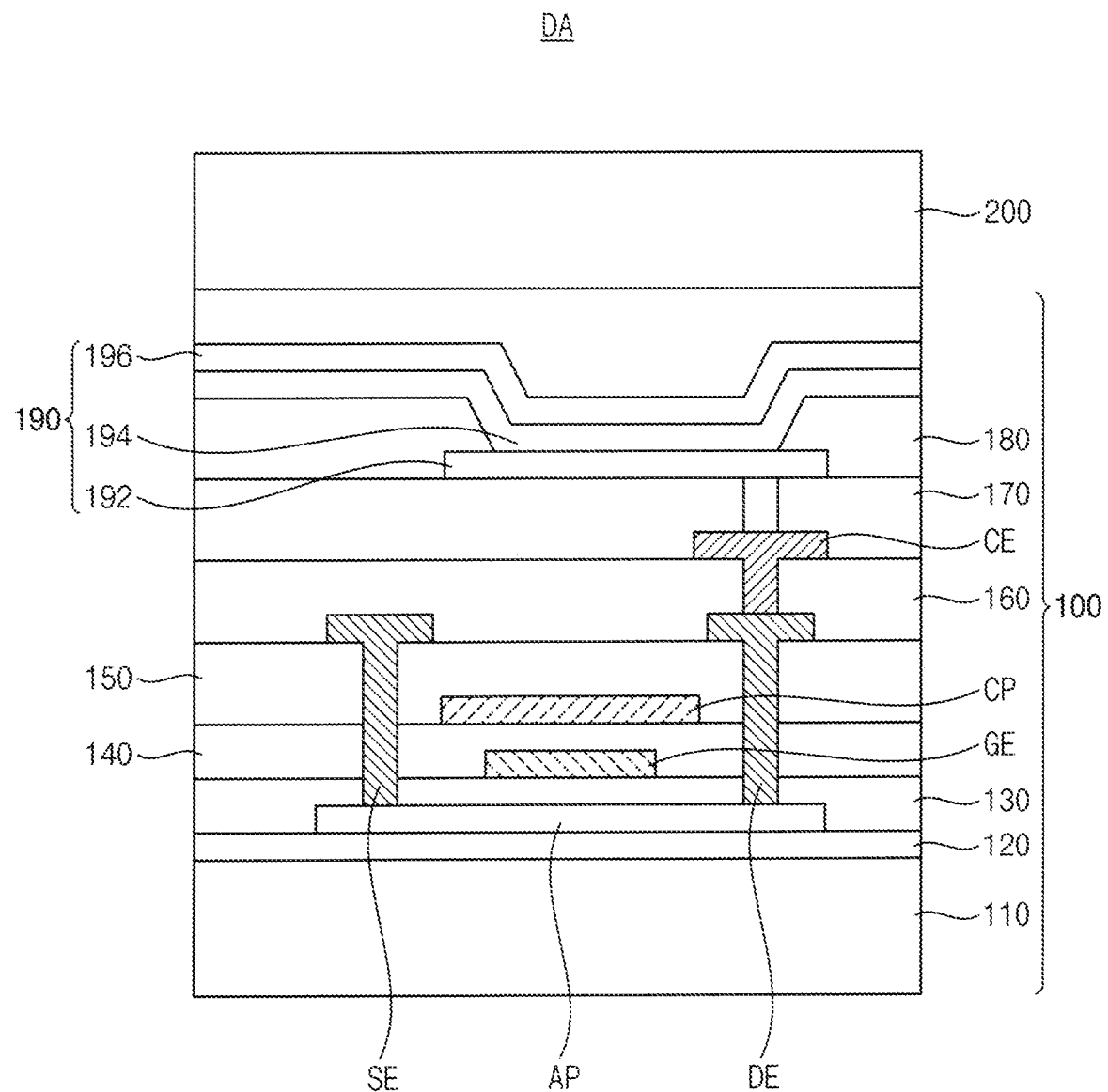
FIG. 2 is a schematic cross-sectional view illustrating a display area of a display device according to an embodiment.

FIG. 2 is a schematic cross-sectional view illustrating a display area of a display device according to an embodiment.

Referring to FIG. 2, a pixel disposed in the display area DA may include a driving element disposed on a base substrate 110 and a light-emitting element electrically connected to the driving element. In an embodiment, the light-emitting element may be an organic light-emitting diode. The driving element may include at least one thin film transistor.

A buffer layer 120 may be disposed on the base substrate 110. An active pattern AP may be disposed on the buffer layer 120.

For example, the base substrate 110 may include glass, quartz, sapphire, a polymeric material, or the like or a combination thereof. In an embodiment, the base substrate 110 may include a transparent rigid material such as glass.

The buffer layer 120 may prevent or reduce permeation of impurities, humidity or external gas from underneath the base substrate 110, and may reduce a roughness of an upper surface of the base substrate 110. For example, the buffer layer 120 may include an inorganic material such as oxide, nitride, or the like or a combination thereof.

A first gate metal pattern including a gate electrode GE may be disposed on the active pattern AP. A first insulation layer 130 may be disposed between the active pattern AP and the gate electrode GE.

A second gate metal pattern including a capacitor electrode pattern CP may be disposed on the gate electrode GE. The capacitor electrode pattern CP may include a capacitor electrode for forming a capacitor, a wiring for transferring signals or the like.

A second insulation layer 140 may be disposed between the first gate metal pattern and the second gate metal pattern. A third insulation layer 150 may be disposed on the second gate metal pattern.

For example, the active pattern AP may include a silicon semiconductor, a metal oxide semiconductor or a combination thereof. In an embodiment, the active pattern AP may include polycrystalline silicon (polysilicon), which may be doped with n-type impurities or p-type impurities.

In another embodiment or in another transistor that is not illustrated, an active pattern may include a metal oxide semiconductor. For example, the active pattern may include two-component compound (ABx), ternary compound (ABxCy) or four-component compound (ABxCyDz), which may include indium (In), zinc (Zn), gallium (Ga), tin (Sn), titanium (Ti), aluminum (Al), hafnium (Hf), zirconium (Zr), magnesium (Mg) or a combination thereof. For example, the active pattern may include zinc oxide (ZnOx), gallium oxide (GaOx), titanium oxide (TiOx), tin oxide (SnOx), indium oxide (InOx), indium-gallium oxide (IGO), indium-zinc oxide (IZO), indium tin oxide (ITO), gallium zinc oxide (GZO), zinc magnesium oxide (ZMO), zinc tin oxide (ZTO), zinc zirconium oxide (ZnZrxOy), indium-gallium-zinc oxide (IGZO), indium-zinc-tin oxide (IZTO), indium-gallium-hafnium oxide (IGHO), tin-aluminum-zinc oxide (TAZO), indium-gallium-tin oxide (IGTO), or the like or a combination thereof.

The first insulation layer 130, the second insulation layer 140 and the third insulation layer 150 may each include silicon oxide, silicon nitride, silicon oxynitride or a combination thereof. Furthermore, the first insulation layer 130, the second insulation layer 140 and the third insulation layer 150 may each include an insulating metal oxide such as aluminum oxide, tantalum oxide, hafnium oxide, zirconium oxide, titanium oxide or the like. For example, the first insulation layer 130, the second insulation layer 140 and the third insulation layer 150 may each have a single-layered structure or a multi-layered structure including silicon nitride and/or silicon oxide, or may have different structures from each other.

The first gate metal pattern and the second gate metal pattern may each include a metal, a metal alloy, a metal nitride, a conductive metal oxide or the like. For example, the first gate metal pattern and the second gate metal pattern may each include gold (Au), silver (Ag), aluminum (Al), copper (Cu), nickel (Ni), platinum (Pt), magnesium (Mg), chromium (Cr), tungsten (W), molybdenum (Mo), titanium (Ti), tantalum (Ta) or an alloy thereof, and may have a single-layered structure or a multi-layered structure including different metal layers.

In an embodiment, the first gate metal pattern and the second gate metal pattern may each have a single-layered structure or a multi-layered structure, which includes Mo, Ti, Cu or a combination thereof. The first gate metal pattern and the second gate metal pattern may each have a single-layered structure or a multi-layered structure, which includes Mo, Ti, or a combination thereof.

A first source metal pattern may be disposed on the third insulation layer 150. The first source metal pattern may include a source electrode SE and a drain electrode DE, which electrically contact the active pattern AP. The source electrode SE and the drain electrode DE may pass through the insulation layers thereunder to contact the active pattern AP, respectively. The first source metal pattern may further include a signal line transferring a signal.

A second source metal pattern may be disposed on the first source metal pattern. The second source metal pattern may include a connection electrode CE to electrically connect the drain electrode DE to a first electrode 192 of an organic light-emitting diode 190 disposed thereon. In an embodiment, the second source metal pattern may further include a power line, a signal line or the like.

The first source metal pattern and the second source metal pattern may each include a metal, a metal alloy, a metal nitride, a conductive metal oxide or the like. For example, the first source metal pattern and the second source metal patterns may each include Au, Ag, Al, Cu, Ni, Pt, Mg, Cr, W, Mo, Ti, Ta or an alloy thereof, and may have a single-layered structure or a multi-layered structure including different metal layers.

In an embodiment, the first source metal pattern and the second source metal pattern may include a material having a melting point lower than the first gate metal pattern and the second gate metal pattern. For example, the first source metal pattern and the second source metal pattern may have a multi-layered structure including at least aluminum.

A fourth insulation layer 160 may be disposed on the first source metal pattern and the second source metal pattern. A fifth insulation layer 170 may be disposed on the second source metal pattern.

The fourth insulation layer 160 and the fifth insulation layer 170 may include an organic material. For example, the fourth insulation layer 160 and the fifth insulation layer 170 may each include an organic insulation material such as a phenol resin, an acryl resin, a polyimide resin, a polyamide resin, a siloxane resin, an epoxy resin or the like.

An organic light-emitting diode 190 may be disposed on the fifth insulation layer 170. The organic light-emitting diode 190 may include a first electrode 192 contacting the connection electrode CE, an organic light-emitting layer 194 disposed on the first electrode 192 and a second electrode 196 disposed on the organic light-emitting layer 194. The organic light-emitting layer 194 of the organic light-emitting diode 190 may be disposed at least in an opening of a pixel-defining layer 180 disposed on the fifth insulation layer 170. The first electrode 192 may be a lower electrode of the organic light-emitting diode 190, and the second electrode 196 may be an upper electrode of the organic light-emitting diode 190.

The first electrode 192 may function as an anode. For example, the first electrode 192 may be formed as a transmitting electrode or a reflecting electrode according to an emission type of the display device. In case that the first electrode 192 is a transmitting electrode, the first electrode 192 may include indium tin oxide, indium zinc oxide, zinc tin oxide, indium oxide, zinc oxide, tin oxide, or the like or a combination thereof. In case that the first electrode 192 is a reflecting electrode, the first electrode 192 may include Au, Ag, Al, Cu, Ni, Pt, Mg, Cr, W, Mo, Ti or a combination thereof, and may have a stacked structure further including the material that may be used for the transmitting electrode.

The pixel-defining layer 180 may include the opening overlapping at least a portion of the first electrode 192. For example, the pixel-defining layer 180 may include an organic insulating material.

The organic light-emitting layer 194 may include at least a light-emitting layer, and may further include at least one of a hole injection layer (HIL), a hole transporting layer (HTL), an electron transporting layer (ETL) and an electron injection layer (EIL). For example, the light-emitting layer may have a pattern shape corresponding to each pixels, and at least one of the hole injection layer, a hole transporting layer, an electron transporting layer and an electron injection layer may be formed as a common layer extending continuously over multiple pixels in the display area DA.

In an embodiment, the organic light-emitting layer 194 may emit a red light, a green light or a blue light. In another embodiment, the organic light-emitting layer 194 may emit a white light. The organic light-emitting layer 194 emitting a white light may have a multi-layer structure including a red-emitting layer, a green-emitting layer and a blue-emitting layer, or a single-layer structure including a mixture of a red-emitting material, a green-emitting material and a blue-emitting material.

The second electrode 196 may be formed as a transmitting electrode or a reflecting electrode according to an emission type of the display device. For example, the second electrode 196 may include a metal, a metal alloy, a metal nitride, a metal fluoride, a conductive metal oxide or a combination thereof.

For example, the second electrode 196 may be formed as a common layer extending continuously over multiple pixels in the display area DA.

A cover substrate 200 may be disposed on the organic light-emitting diode 190. For example, the cover substrate 200 may include glass, quartz, sapphire, a polymeric material, or the like or a combination thereof. In an embodiment, the cover substrate 200 may include a transparent rigid material such as glass.

For example, a spacer may be disposed under the cover substrate 200 to support the cover substrate 200. The spacer may be disposed between the cover substrate 200 and the organic light-emitting diode 190 or between the pixel-defining layer 180 and the second electrode 196 of the organic light-emitting diode 190.

A space between the cover substrate 200 and the organic light-emitting diode 190 may have a vacuum state or may be filled with a gas or a sealing member. The sealing member may include an organic layer, an inorganic layer or a combination thereof.

Figure 3:
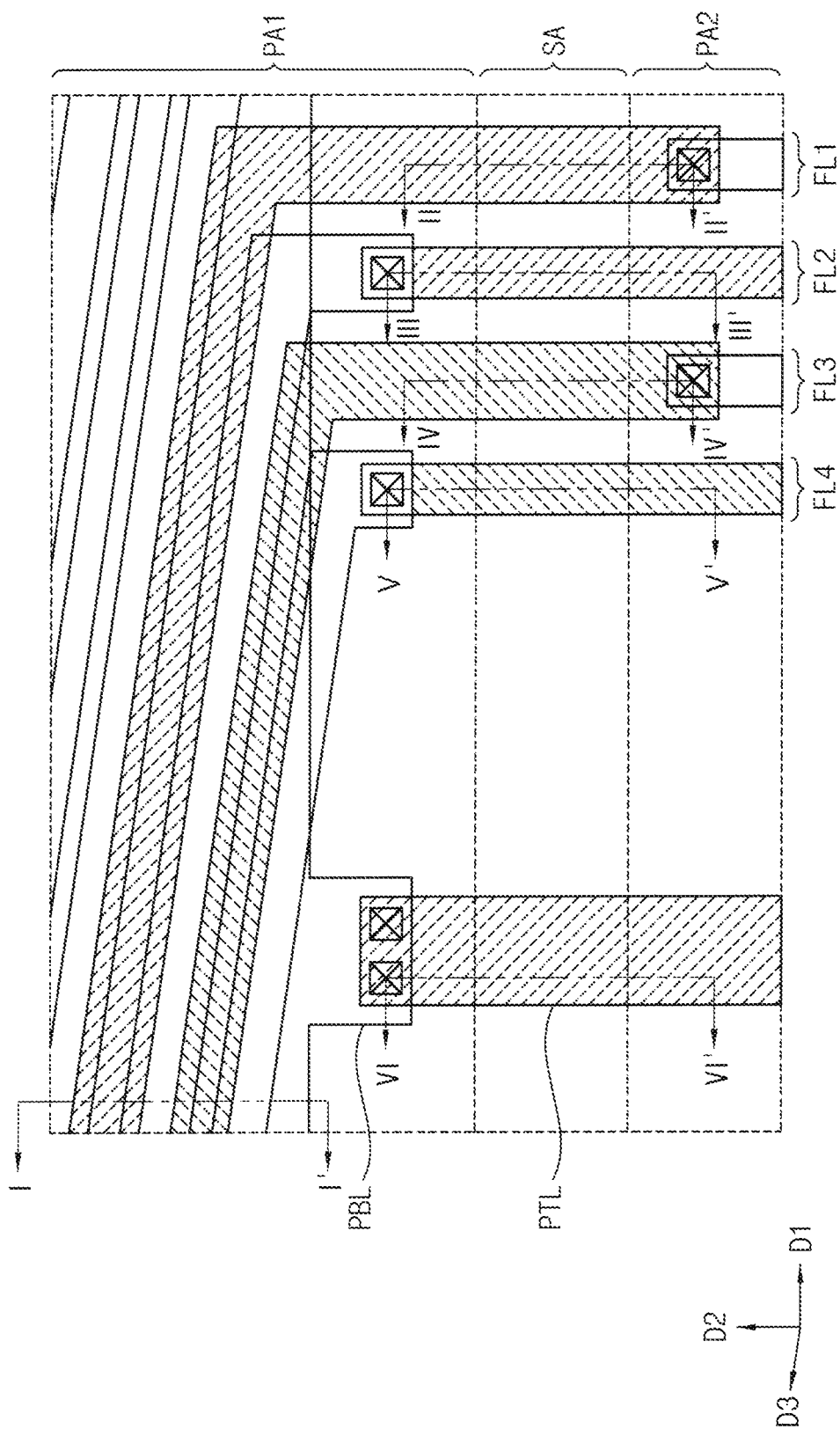
FIG. 3 is an enlarged schematic plan view illustrating region 'A' of FIG. 1.
Figure 4:
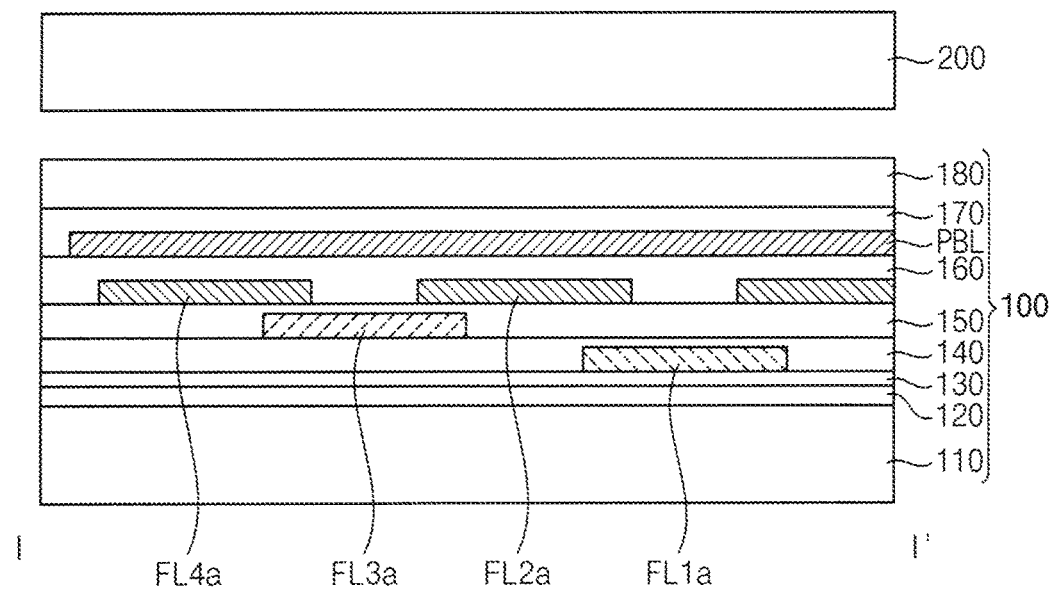
FIG. 4 is a schematic cross-sectional view taken along line I-I' of FIG. 3.
Figure 5:
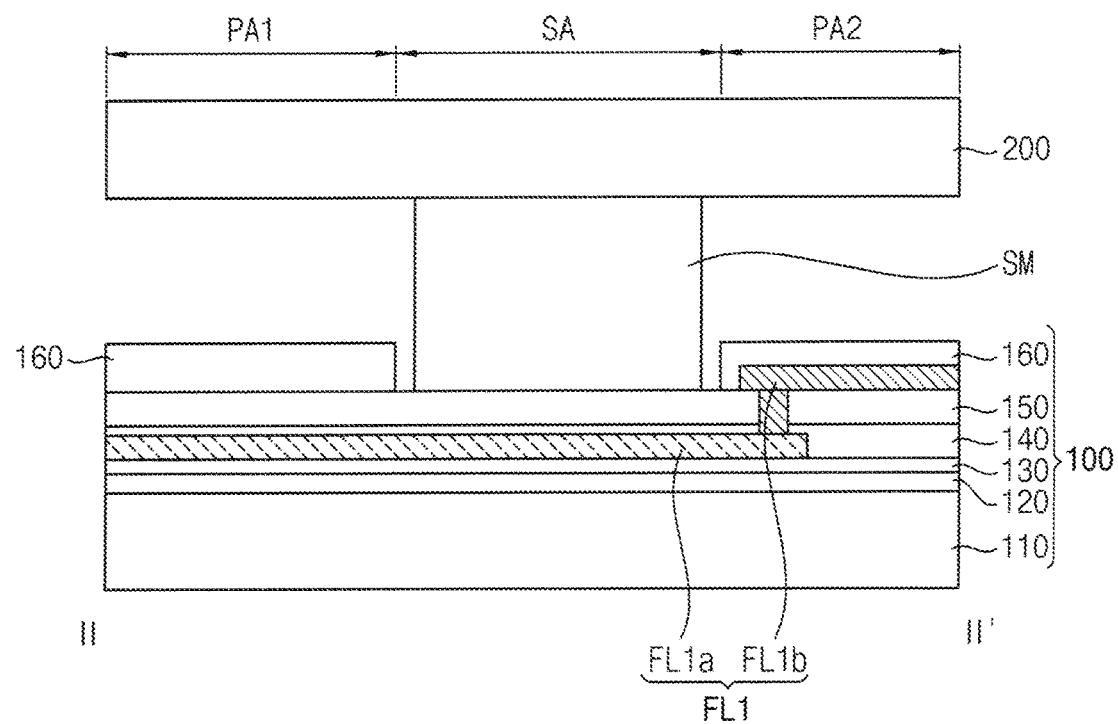
FIG. 5 is a schematic cross-sectional view taken along line II-II' of FIG. 3.
Figure 6:
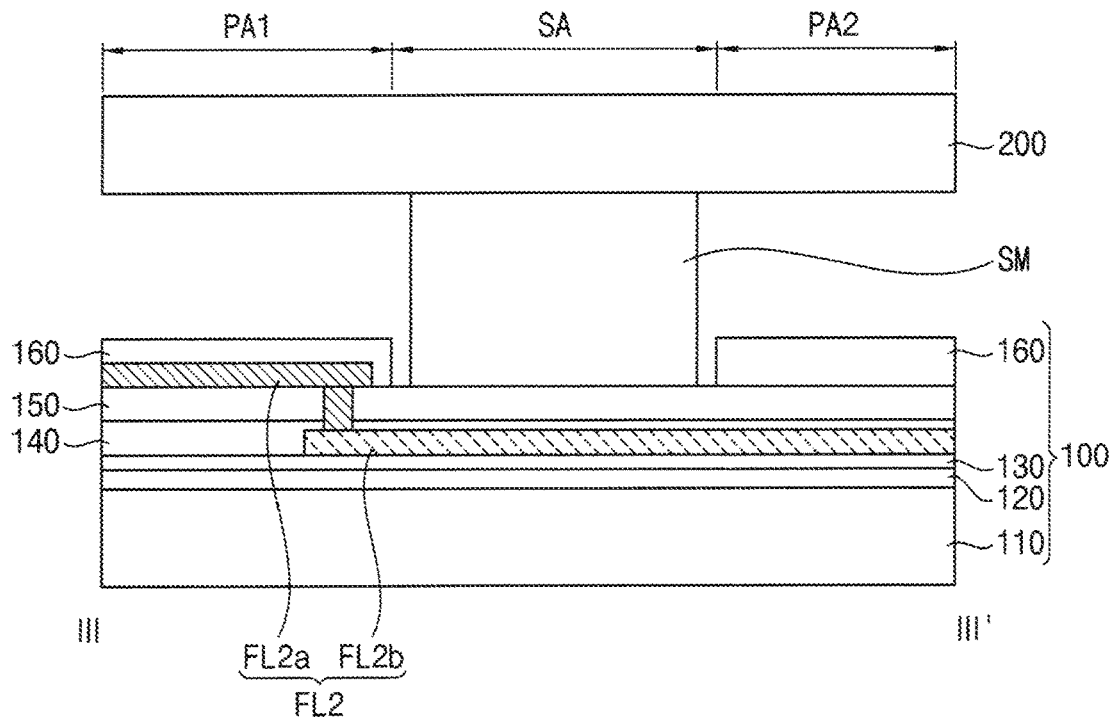
FIG. 6 is a schematic cross-sectional view taken along line III-III' of FIG. 3.
Figure 7:
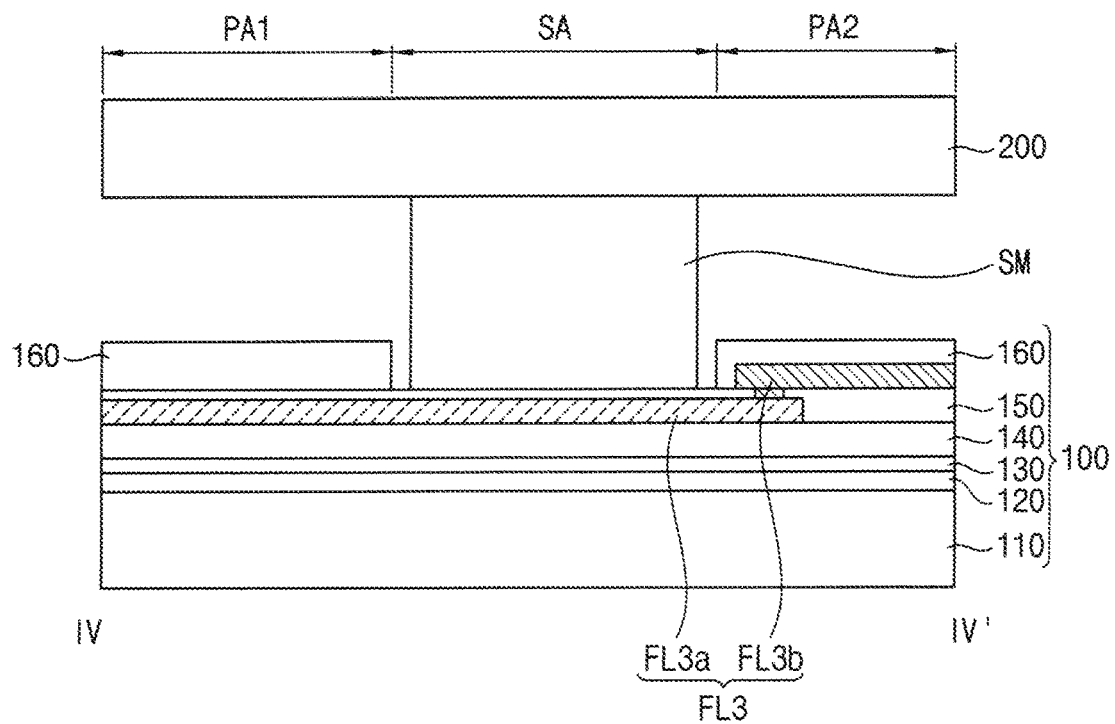
FIG. 7 is a schematic cross-sectional view taken along line IV-IV' of FIG. 3.
Figure 8:
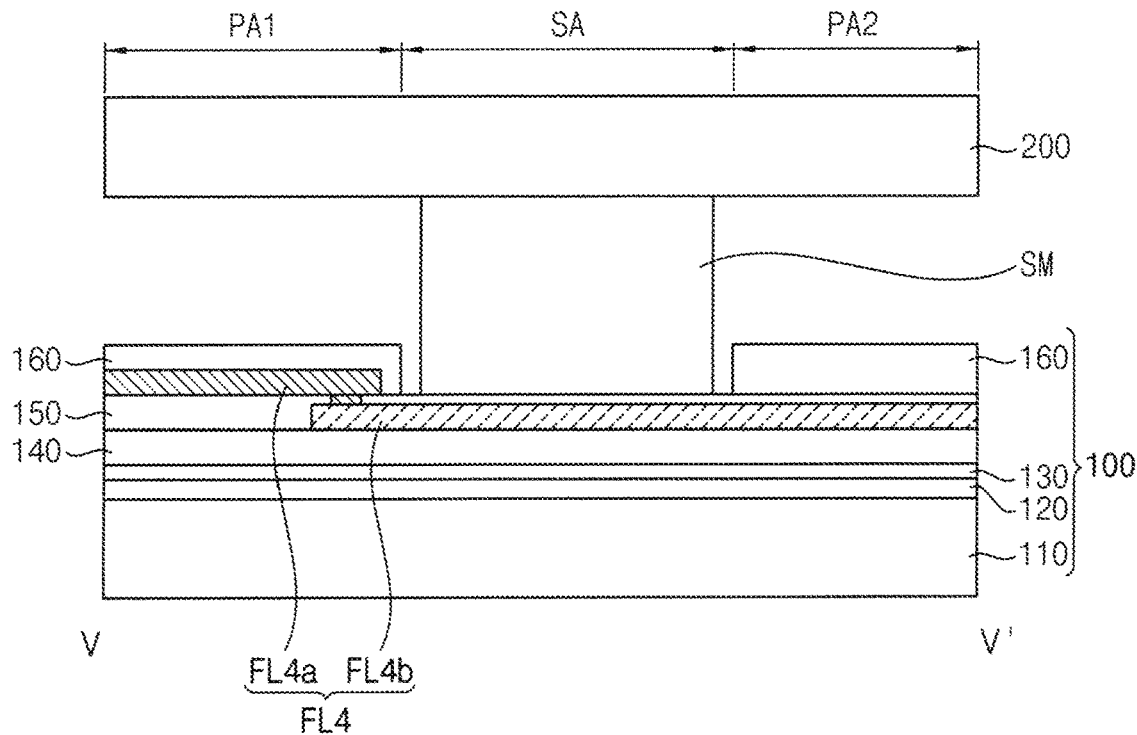
FIG. 8 is a schematic cross-sectional view taken along line V-V' of FIG. 3.
Figure 9:
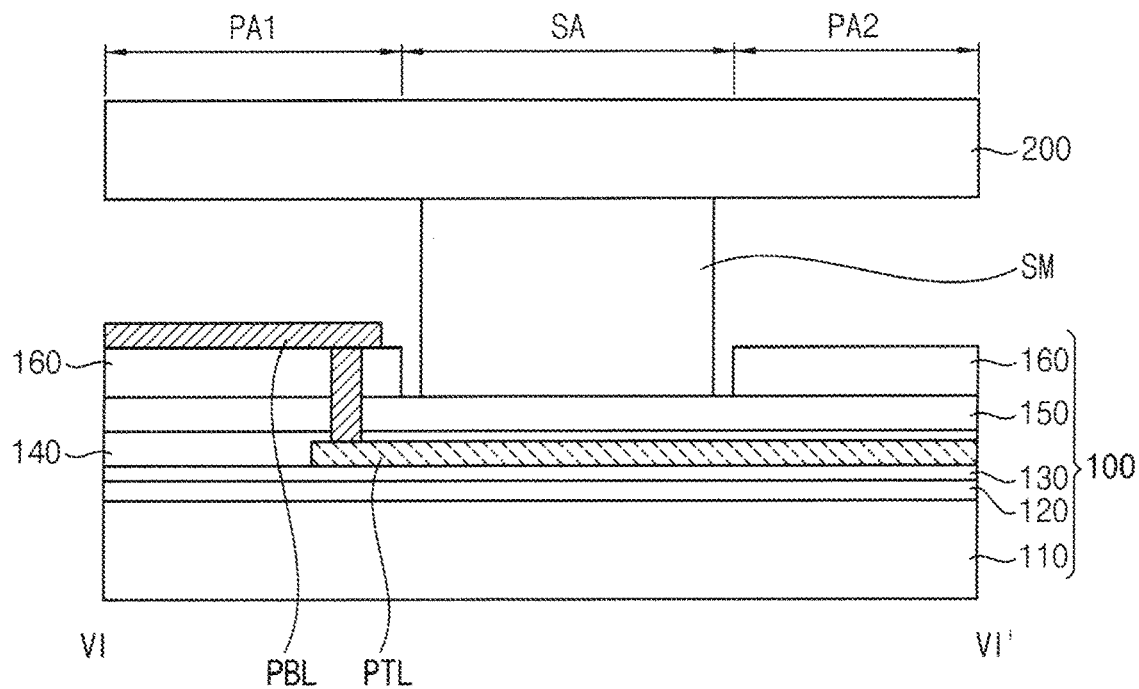
FIG. 9 is a schematic cross-sectional view taken along line VI-VI' of FIG. 3.

FIG. 3 is an enlarged schematic plan view illustrating region 'A' of FIG. 1. FIG. 4 is a schematic cross-sectional view taken along line I-I' of FIG. 3. FIG. 5 is a schematic cross-sectional view taken along line II-II' of FIG. 3. FIG. 6 is a schematic cross-sectional view taken along line III-III' of FIG. 3. FIG. 7 is a schematic cross-sectional view taken along line IV-IV' of FIG. 3. FIG. 8 is a schematic cross-sectional view taken along line V-V' of FIG. 3. FIG. 9 is a schematic cross-sectional view taken along line VI-VI' of FIG. 3.

Referring to FIGS. 1, 3 and 4, a display device according to an embodiment may include a transfer wiring electrically connecting a pixel array to a pad part PD. For example, the transfer wiring may include a fan-out wiring transferring a data signal. The fan-out wiring may include a first fan-out line FL1, a second fan-out line FL2, a third fan-out line FL3 and a fourth fan-out line FL4, which may be arranged to be parallel with each other. The fan-out wiring may have a configuration in which the first to fourth fan-out lines FL1, FL2, FL3 and FL4 may be repeated.

The fan-out lines FL1, FL2, FL3 and FL4 may be disposed in a sealing area SA and a first peripheral area PA1 adjacent to the sealing area SA. The first peripheral area PA1 may be disposed between the sealing area SA and the display area DA. Furthermore, the fan-out lines FL1, FL2, FL3 and FL4 may extend into a second peripheral area PA2 spaced apart from the first peripheral area PA1 and adjacent to the sealing area SA.

In an embodiment, adjacent fan-outlines may be spaced apart from each other in the sealing area SA and may overlap each other in the first peripheral area PA1, in a plan view. The fan-out lines FL1, FL2, FL3 and FL4 may be spaced apart from each other in a first direction D1 and may extend in a second direction D2 perpendicular to the first direction D1, in the sealing area SA. The fan-out lines FL1, FL2, FL3 and FL4 may extend in a third direction D3 crossing the first direction D1 and the second direction D2 in the first peripheral area PA1.

A power bus line PBL may be disposed in the first peripheral area PA1 and may extend in the first direction D1. The power bus line PBL may overlap the fan-out lines FL1, FL2, FL3 and FL4.

At least one of the fan-out lines FL1, FL2, FL3 and FL4 may include extension patterns, which may be disposed in different layers and in different areas.

Referring to FIGS. 3 to 5, the first fan-out line FL1 may include a first extension pattern FL1a and a second extension pattern FL1b. The first extension pattern FL1a may be disposed in the first peripheral area PA1 and the sealing area SA. The second extension pattern FL1b may be disposed in the second peripheral area PA2. The first extension pattern FL1a may extend in the third direction D3 in the first peripheral area PA1 and may extend in the second direction D2 in the sealing area SA.

In an embodiment, the first extension pattern FL1a may be formed from the first gate metal pattern of the display area and may be disposed in a same layer as the first gate metal pattern. The second extension pattern FL1b may be formed from the first source metal pattern of the display area and may be disposed in a same layer as the first source metal pattern.

For example, in the sealing area SA and the peripheral areas PA1 and PA2, a buffer layer 120 and a first insulation layer 130, which extend from the display area, may be disposed on a base substrate 110. The first extension pattern FL1a may be disposed on the first insulation layer 130. A second insulation layer 140 and a third insulation layer 150, which extend from the display area, may be disposed on the first extension pattern FL1a. The second extension pattern FL1b and a fourth insulation layer 160 may be disposed on the third insulation layer 150. A portion of the fourth insulation layer 160 may cover the second extension pattern FL1b.

A portion of the first extension pattern FL1a may be disposed in the second peripheral area PA2. The second extension pattern FL1b may pass through insulation layers thereunder to electrically contact the first extension pattern FL1a in the second peripheral area PA2.

A sealing member SM may be disposed in the sealing area SA. The sealing member SM may combine the array substrate 100 and the cover substrate 200 to encapsulate the display area.

A layer including an organic material may be removed in the sealing area SA to prevent outgassing and sealing failure. For example, the fourth insulation layer 160 may be removed in the sealing area SA. Thus, the sealing member SM may contact the third insulation layer 150 including an inorganic material.

The sealing member SM may substantially include an inorganic material such as glass, ceramics, or the like or a combination thereof. For example, the sealing member SM may be formed from a glass frit, a ceramic frit or the like. For example, a frit paste may be coated on the cover substrate 200 or the array substrate 100 to correspond to the sealing area SA. The frit paste may be sintered between the cover substrate 200 and the array substrate 100 by heat, UV, laser or the like to form the sealing member SM.

Referring to FIGS. 3, 4, and 6, the second fan-out line FL2 may include a first extension pattern FL2a and a second extension pattern FL2b. The first extension pattern FL2a may be disposed in the first peripheral area PA1. The second extension pattern FL2b may be disposed in the second peripheral area PA2 and sealing area SA. At least a portion of the first extension pattern FL2a may extend in the third direction D3 in the first peripheral area PA1. At least a portion of the second extension pattern FL2b may extend in the second direction D2 in the sealing area SA.

In an embodiment, the first extension pattern FL2a may be formed from the first source metal pattern of the display area and may be disposed in a same layer as the first source metal pattern. The second extension pattern FL2b may be formed from the first gate metal pattern of the display area and may be disposed in a same layer as the first gate metal pattern.

For example, the second extension pattern FL2*b* may be disposed between the first insulation layer 130 and the second insulation layer 140. The first extension pattern FL2*a* may be disposed on the third insulation layer 150. A portion of the fourth insulation layer 160 may cover the first extension pattern FL2*a*.

A portion of the second extension pattern FL2*b* may be disposed in the first peripheral area PA1. The first extension pattern FL2*a* may pass through insulation layers thereunder to electrically contact the second extension pattern FL2*b* in the first peripheral area PA1.

In an embodiment, the first extension pattern FL2*a* of the second fan-out line FL2 may partially overlap the first extension pattern FL1*a* of the first fan-out line FL1 in the first peripheral area PA1, in a plan view. Furthermore, the second extension pattern FL2*b* of the second fan-out line FL2 may be spaced apart from the first extension pattern FL1*a* of the first fan-out line FL1 in the sealing area SA, in a plan view.

Referring to FIGS. 3, 4, and 7, the third fan-out line FL3 may include a first extension pattern FL3*a* and a second extension pattern FL3*b*. The first extension pattern FL3*a* may be disposed in the first peripheral area PA1 and the sealing area SA. The second extension pattern FL3*b* may be disposed in the second peripheral area PA2. The first extension pattern FL3*a* may extend in the third direction D3 in the first peripheral area PA1 and may extend in the second direction D2 in the sealing area SA.

In an embodiment, the first extension pattern FL3*a* may be formed from the second gate metal pattern of the display area and may be disposed in a same layer as the second gate metal pattern. The second extension pattern FL3*b* may be formed from the first source metal pattern of the display area and may be disposed in a same layer as the first source metal pattern.

For example, the first extension pattern FL3*a* may be disposed between the third insulation layer 150 and the second insulation layer 140. The second extension pattern FL3*b* may be disposed on the third insulation layer 150. A portion of the fourth insulation layer 160 may cover the second extension pattern FL3*b*.

A portion of the first extension pattern FL3*a* may be disposed in the second peripheral area PA2. The second extension pattern FL3*b* may pass through insulation layers thereunder to electrically contact the first extension pattern FL3*a* in the second peripheral area PA2.

In an embodiment, the first extension pattern FL3*a* of the third fan-out line FL3 may partially overlap the first extension pattern FL2*a* of the second fan-out line FL2 in the first peripheral area PA1, in a plan view. Furthermore, the first extension pattern FL3*a* of the third fan-out line FL3 may be spaced apart from the second extension pattern FL2*b* of the second fan-out line FL2 in the sealing area SA, in a plan view.

Referring to FIGS. 3, 4, and 8, the fourth fan-out line FL4 may include a first extension pattern FL4*a* and a second extension pattern FL4*b*. The first extension pattern FL4*a* may be disposed in the first peripheral area PA1. The second extension pattern FL4*b* may be disposed in the second peripheral area PA2 and sealing area SA. At least a portion of the first extension pattern FL4*a* may extend in the third direction D3 in the first peripheral area PA1. At least a portion of the second extension pattern FL4*b* may extend in the second direction D2 in the sealing area SA.

In an embodiment, the first extension pattern FL4*a* may be formed from the first source metal pattern of the display area and may be disposed in a same layer as the first source metal pattern. The second extension pattern FL4*b* may be formed from the second gate metal pattern of the display area and may be disposed in a same layer as the second gate metal pattern.

For example, the second extension pattern FL4*b* may be disposed between the third insulation layer 150 and the second insulation layer 140. The first extension pattern FL4*a* may be disposed on the third insulation layer 150. A portion of the fourth insulation layer 160 may cover the first extension pattern FL4*a*.

A portion of the second extension pattern FL4*b* may be disposed in the first peripheral area PA1. The first extension pattern FL4*a* may pass through insulation layers thereunder to electrically contact the second extension pattern FL4*b* in the first peripheral area PA1.

In an embodiment, the first extension pattern FL4*a* of the fourth fan-out line FL4 may partially overlap the first extension pattern FL3*a* of the third fan-out line FL3 in the first peripheral area PA1, in a plan view. Furthermore, the second extension pattern FL4*b* of the fourth fan-out line FL4 may be spaced apart from the first extension pattern FL3*a* of the third fan-out line FL3 in the sealing area SA, in a plan view.

Referring to FIGS. 3, 4 and 9, the power bus line PBL may be disposed in the first peripheral area PA1. A power transfer line PTL may be disposed in the sealing area SA and the second peripheral area PA2 to electrically connect the power bus line PBL to the pad part. At least a portion of the power bus line PBL may extend in the first direction D1 in the first peripheral area PA1. The power transfer line PTL may extend in the second direction D2 in the sealing area SA.

In an embodiment, the power bus line PBL may be formed from a same layer as the second source metal pattern of the display area and may be disposed in a same layer as the second source metal pattern. The power transfer line PTL may be formed from a same layer as the first gate metal pattern of the display area and may be disposed in a same layer as the first gate metal pattern.

For example, the power bus line PBL may be disposed on the fourth insulation layer 160. The power transfer line PTL may be disposed between the first insulation layer 130 and the second insulation layer 140.

A portion of the power transfer line PTL may be disposed in the first peripheral area PA1. The power bus line PBL may pass through insulation layers thereunder to electrically contact the power transfer line PTL in the first peripheral area PA1.

However, embodiments are not limited thereto. For example, the power transfer line PTL may be formed from the second gate metal pattern of the display area and may be disposed between the second insulation layer 140 and the third insulation layer 150.

In an embodiment, the pixel array in the display area may have a pentile configuration. For example, the first fan-out line FL1 and the third fan-out line FL3 may provide a data signal to a red pixel and a blue pixel. The second fan-out line FL2 and the fourth fan-out line FL4 may provide a data signal to a green pixel. However, embodiments are not limited thereto. For example, the pixel array in the display area may have an RGB stripe configuration.

In an embodiment, the extension patterns overlapping the sealing area SA may extend in the second direction D2 as illustrated in FIG. 3. However, embodiments are not limited thereto. For example, the extension patterns overlapping the sealing area SA may extend in a diagonal direction such as the third direction D3 depending on a shape or an arrangement of the sealing area SA.

In an embodiment, the second extension patterns FL1*b*, FL2*b*, FL3*b* and FL4*b* of the fan-out lines FL1, FL2, FL3 and FL4 may extend to the pad part to be electrically connected to corresponding connection pads, respectively.

In an embodiment, the first extension patterns FL2*a* and FL4*a* of the second fan-out line FL2 and the fourth fan-out line FL4 may be formed from a same layer as the first source metal pattern of the display area. However, embodiments are not limited thereto. For example, the first extension patterns FL2*a* and FL4*a* of the second fan-out line FL2 and the fourth fan-out line FL4 may be formed from a same layer as the second source metal pattern of the display area. The power bus line PBL may be formed from a same layer as the first source metal pattern.

Furthermore, the fan-out lines FL1, FL2, FL3 and FL4 may include a bridge pattern disposed in the first peripheral area PA1 or in the second peripheral area PA2, as desired.

In an embodiment, the extension patterns overlapping the sealing area SA may include a metal such as molybdenum, titanium, or the like or a combination thereof, which has a relatively high melting point, and may exclude a metal such as aluminum or the like, which has a relatively low melting point. For example, the extension patterns overlapping the sealing area SA may include a conductive material having a melting point equal to or more than about 1,200° C. In an embodiment, the melting point may be equal to or more than about 1,500° C.

According to embodiments, fan-out lines may be formed by at least three metal patterns disposed in different layers. Thus, a peripheral area where the fan-out lines may be disposed may be reduced.

Furthermore, a portion of the fan-out lines may be formed from a source metal pattern having a relatively great conductivity. Thus, a scan-on-time of a display device may be reduced, and high-speed driving may be achieved.

Furthermore, extension patterns disposed in a sealing area include a metal having a relatively high melting point. Thus, damage due to a laser sintering process may be prevented or reduced.

Furthermore, each of the fan-out lines may include extension patterns disposed in different layers and including different materials. Thus, resistance distribution due to resistance difference from material difference may be reduced.

Figure 10:
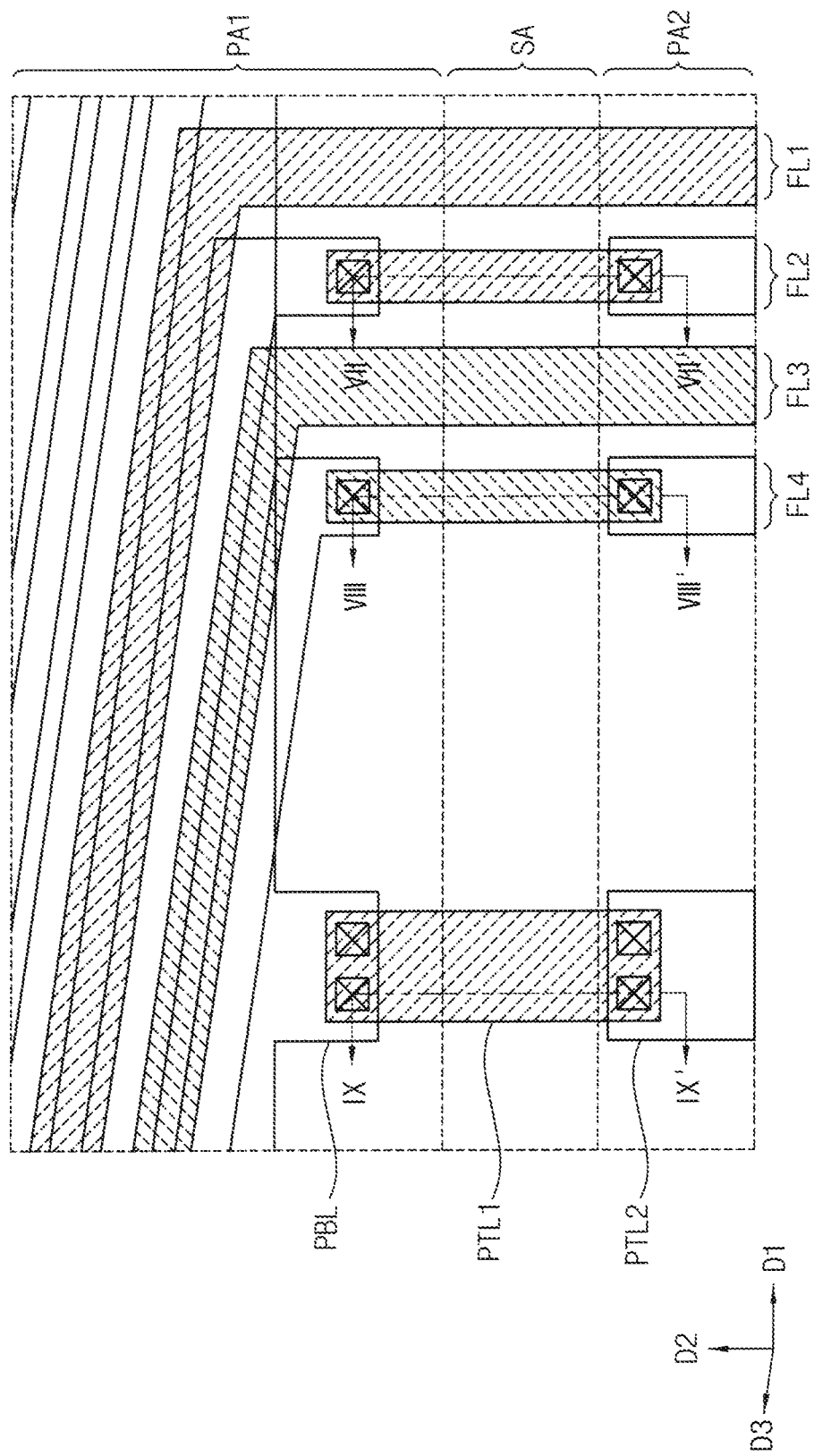
FIG. 10 is an enlarged schematic plan view illustrating a peripheral area of a display device according to an embodiment.
Figure 11:
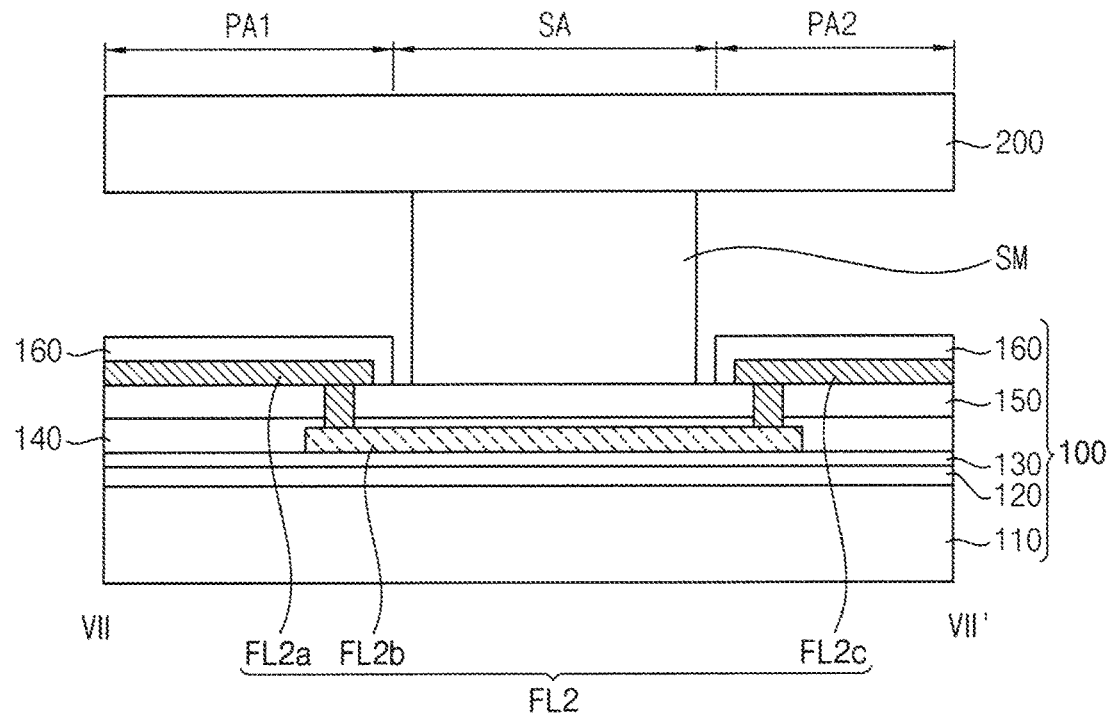
FIG. 11 is a schematic cross-sectional view taken along line VII-VII' of FIG. 10.
Figure 12:
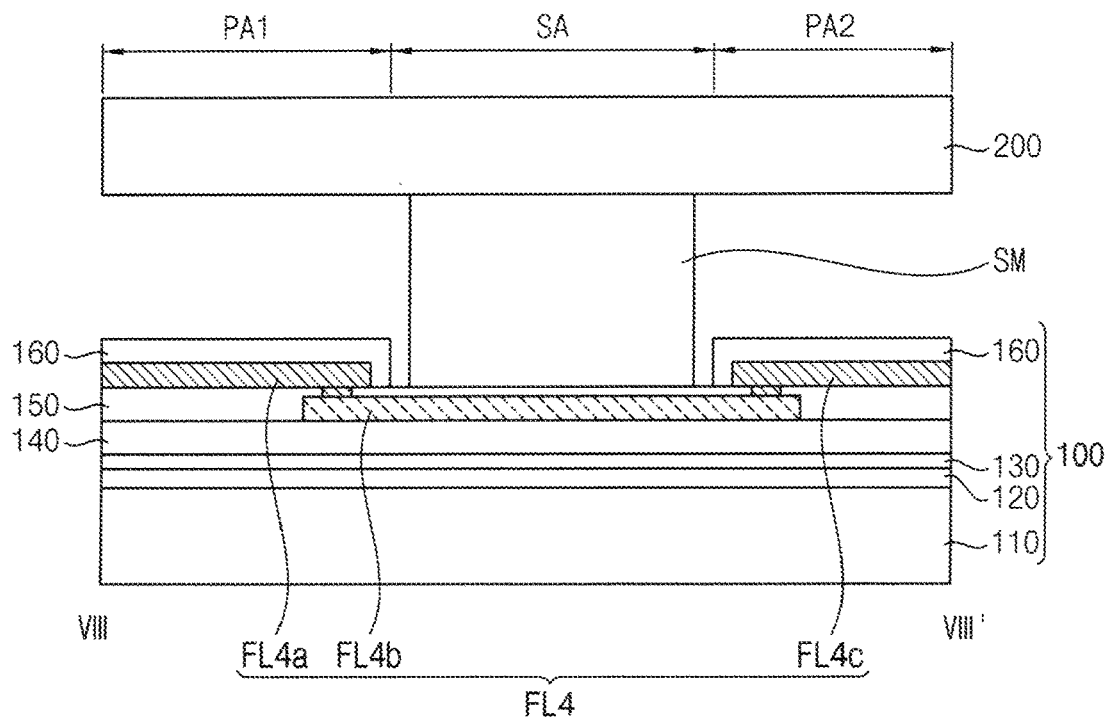
FIG. 12 is a schematic cross-sectional view taken along line VIII-VIII' of FIG. 10.
Figure 13:
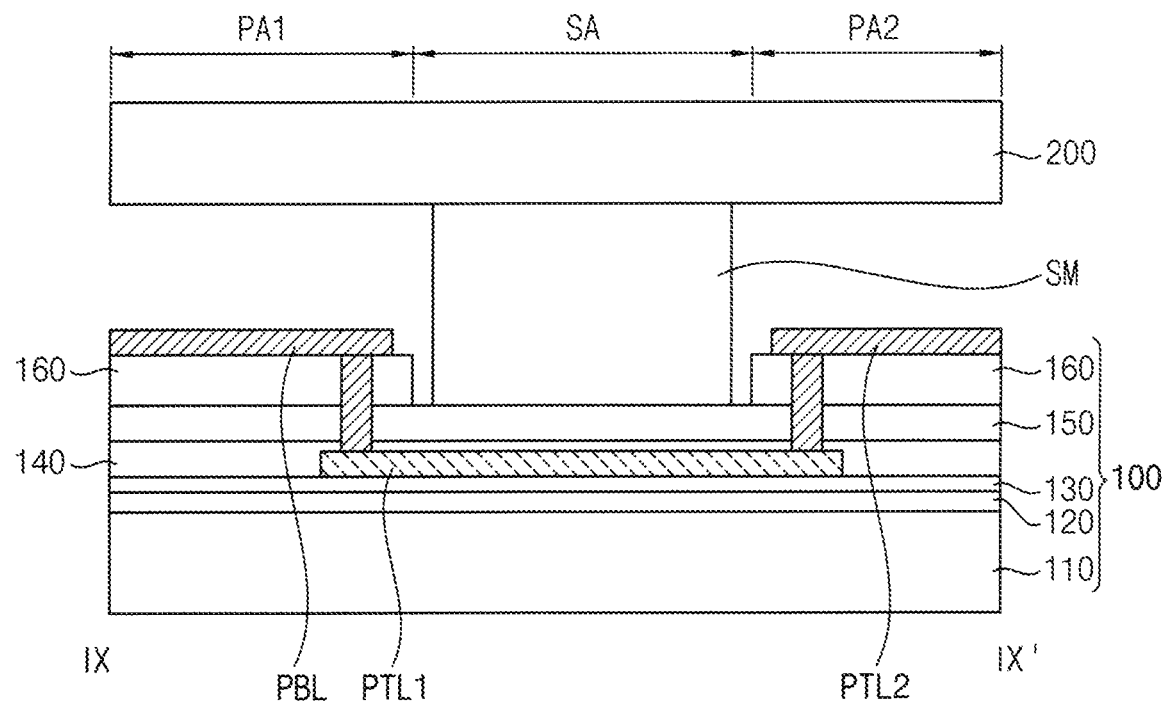
FIG. 13 is a schematic cross-sectional view taken along line IX-IX' of FIG. 10.

FIG. 10 is an enlarged schematic plan view illustrating a peripheral area of a display device according to an embodiment. FIG. 11 is a schematic cross-sectional view taken along line VII-VII' of FIG. 10. FIG. 12 is a schematic cross-sectional view taken along line VIII-VIII' of FIG. 10. FIG. 13 is a schematic cross-sectional view taken along line IX-IX' of FIG. 10.

Referring to FIG. 10, a display device according to an embodiment may include a transfer wiring. The transfer wiring may include a fan-out wiring transferring a data signal. The fan-out wiring may include a first fan-out line FL1, a second fan-out line FL2, a third fan-out line FL3 and a fourth fan-out line FL4, which may be arranged to be parallel with each other. The fan-out wiring may have a configuration in which the first to fourth fan-out lines FL1, FL2, FL3 and FL4 may be repeated.

A power bus line PBL may be disposed in a first peripheral area PA1 and extends in a first direction D1. The power bus line PBL may overlap the fan-out lines FL1, FL2, FL3 and FL4.

The first fan-out line FL1 and the third fan-out line FL3 may extend continuously in a same layer in the first peripheral area PA1, a sealing area SA and a second peripheral area PA2.

For example, the first fan-out line FL1 may be formed from a same layer as the first gate metal pattern of the display area and may be disposed in a same layer as the first gate metal pattern. The third fan-out line FL3 may be formed from a same layer as the second gate metal pattern of the display area and may be disposed in a same layer as the second gate metal pattern.

Referring to FIGS. 10 and 11, the second fan-out line FL2 may include a first extension pattern FL2*a* disposed in the first peripheral area PA1, a second extension pattern FL2*b* disposed in the sealing area SA and a third extension pattern FL2*c* disposed in the second peripheral area PA2. At least a portion of the second extension pattern FL2*b* may extend in a second direction D2 perpendicular to the first direction D1 in the sealing area SA. At least a portion of the first extension pattern FL2*a* may extend in a third direction D3 crossing the first direction D1 and the second direction D2 in the first peripheral area PA1.

In an embodiment, the first extension pattern FL2*a* and the third extension pattern FL2*c* may be formed from a same layer as the first source metal pattern of the display area and may be disposed in a same layer as the first source metal pattern. The second extension pattern FL2*b* may be formed from a same layer as the first gate metal pattern of the display area and may be disposed in a same layer as the first gate metal pattern.

For example, the second extension pattern FL2*b* may be disposed between a first insulation layer 130 and a second insulation layer 140. The first extension pattern FL2*a* and the third extension pattern FL2*c* may be disposed on a third insulation layer 150. At least a portion of a fourth insulation layer 160 may cover the first extension pattern FL2*a* and the third extension pattern FL2*c*.

A portion of the second extension pattern FL2*b* may be disposed in the first peripheral area PA1 and the second peripheral area PA2. The first extension pattern FL2*a* may pass through insulation layers thereunder to electrically contact the second extension pattern FL2*b* in the first peripheral area PA1. The third extension pattern FL2*c* may pass through insulation layers thereunder to electrically contact the second extension pattern FL2*b* in the second peripheral area PA2.

At least a portion of the first extension pattern FL2*a* of the second fan-out line FL2 may overlap the first fan-out line FL1 and the third fan-out line FL3 in the first peripheral area PA1. The second extension pattern FL2*b* of the second fan-out line FL2 may be spaced apart from the first fan-out line FL1 and the third fan-out line FL3 in the second peripheral area PA2.

Referring to FIGS. 10 and 12, the fourth fan-out line FL4 may include a first extension pattern FL4*a* disposed in the first peripheral area PA1, a second extension pattern FL4*b* disposed in the sealing area SA and a third extension pattern FL4*c* disposed in the second peripheral area PA2. At least a portion of the first extension pattern FL4*a* may extend in the third direction D3 in the first peripheral area PA1. At least a portion of the second extension pattern FL4*b* may extend in the second direction D2 in the sealing area SA.

In an embodiment, the first extension pattern FL4*a* and the third extension pattern FL4*c* may be formed from a same layer as the first source metal pattern of the display area and may be disposed in a same layer as the first source metal pattern. The second extension pattern FL4*b* may be formed from a same layer as the second gate metal pattern of the display area and may be disposed in a same layer as the second gate metal pattern.

For example, the second extension pattern FL4*b* may be disposed between the third insulation layer 150 and the second insulation layer 140. The first extension pattern FL4*a* and the third extension pattern FL4*c* may be disposed on the third insulation layer 150. At least a portion of the fourth insulation layer 160 may cover the first extension pattern FL4*a* and the third extension pattern FL4*c*.

A portion of the second extension pattern FL4*b* may be disposed in the first peripheral area PA1 and the second peripheral area PA2. The first extension pattern FL4*a* may pass through insulation layers thereunder to electrically contact the second extension pattern FL4*b* in the first peripheral area PA1. The third extension pattern FL4*c* may pass through insulation layers thereunder to electrically contact the second extension pattern FL4*b* in the second peripheral area PA2.

At least a portion of the first extension pattern FL4*a* of the fourth fan-out line FL4 may overlap the third fan-out line FL3 in the first peripheral area PA1. The second extension pattern FL4*b* of the fourth fan-out line FL4 may be spaced apart from the third fan-out line FL3 in the second peripheral area PA2.

Referring to FIGS. 10 and 13, the power bus line PBL may be disposed in the first peripheral area PA1. A power transfer line PTL electrically connects the power bus line PBL to a pad part. The power transfer line PTL may include a first power transfer line PTL1 disposed in the sealing area SA and a second power transfer line PTL2 disposed in the second peripheral area PA2. At least a portion of the power bus line PBL may extend in the first direction D1 in the first peripheral area PA1. At least a portion of the first power transfer line PTL1 may extend in the second direction D2 in the sealing area SA. At least a portion of the second power transfer line PTL2 may extend in the second direction D2 in the second peripheral area PA2.

In an embodiment, the power bus line PBL and the second power transfer line PTL2 may be formed from a same layer as the second source metal pattern of the display area and may be disposed in a same layer as the second source metal pattern. The first power transfer line PTL1 may be formed from a same layer as the first gate metal pattern of the display area and may be disposed in a same layer as the first gate metal pattern.

For example, the power bus line PBL and the second power transfer line PTL2 may be disposed on the fourth insulation layer 160. The first power transfer line PTL1 may be disposed between the first insulation layer 130 and the second insulation layer 140.

A portion of the first power transfer line PTL1 may be disposed in the first peripheral area PA1 and the second peripheral area PA2. The power bus line PBL may pass through insulation layers thereunder to electrically contact the first power transfer line PTL1 in the first peripheral area PA1. The second power transfer line PTL2 may pass through insulation layers thereunder to electrically contact the first power transfer line PTL1 in the second peripheral area PA2.

However, embodiments are not limited thereto. For example, the first power transfer line PTL1 may be formed from a same layer as the second gate metal pattern of the display area to be disposed between the second insulation layer 140 and the third insulation layer 150.

In another embodiment, the second power transfer line PTL2 may be formed from a same layer as the second gate metal pattern or the first source metal pattern of the display area.

FIG. 14 is an enlarged schematic plan view illustrating a peripheral area of a display device according to an embodiment.

Referring to FIG. 14, adjacent fan-out lines may be spaced apart from each other in a sealing area SA, and may partially overlap each other in a first peripheral area PA1 and a second peripheral area PA2, in a plan view. The fan-out lines FL1, FL2, FL3 and FL4 may be spaced apart from each other in a first direction D1 in the sealing area SA, and may extend in a second direction D2 perpendicular to the first direction D1. The fan-out lines FL1, FL2, FL3 and FL4 may extend in a third direction D3 crossing the first direction D1 and the second direction D2 in the first peripheral area PA1 and the second peripheral area PA2.

A first fan-out line FL1 may include a first extension pattern FL1*a* disposed in the first peripheral area PA1 and the sealing area SA, and a second extension pattern FL1*b* disposed in the second peripheral area PA2. The first extension pattern FL1*a* may extend in the third direction D3 in the first peripheral area PA1 and may extend in the second direction D2 in the sealing area SA. At least a portion of the second extension pattern FL1*b* may extend in the third direction D3 in the second peripheral area PA2.

A second fan-out line FL2 may include a first extension pattern FL2*a* disposed in the first peripheral area PA1, and a second extension pattern FL2*b* disposed in the sealing area SA and the second peripheral area PA2. At least a portion of the first extension pattern FL2*a* may extend in the third direction D3 in the first peripheral area PA1. The second extension pattern FL2*b* may extend in the second direction D2 in the sealing area SA, and may extend in the third direction D3 in the second peripheral area PA2. The second extension pattern FL2*b* of the second fan-out line FL2 may partially overlap the second extension pattern FL1*b* of the first fan-out line FL1 in the second peripheral area PA2.

A third fan-out line FL3 may include a first extension pattern FL3*a* disposed in the first peripheral area PA1 and the sealing area SA, and a second extension pattern FL3*b* disposed in the second peripheral area PA2. The first extension pattern FL3*a* may extend in the third direction D3 in the first peripheral area PA1 and may extend in the second direction D2 in the sealing area SA. At least a portion of the second extension pattern FL3*b* may extend in the third direction D3 in the second peripheral area PA2. The second extension pattern FL3*b* of the third fan-out line FL3 may partially overlap the second extension pattern FL2*b* of the second fan-out line FL2 in the second peripheral area PA2.

A fourth fan-out line FL4 may include a first extension pattern FL4*a* disposed in the first peripheral area PA1, and a second extension pattern FL4*b* disposed in the sealing area SA and the second peripheral area PA2. At least a portion of the first extension pattern FL4*a* may extend in the third direction D3 in the first peripheral area PA1. The second extension pattern FL4*b* may extend in the second direction D2 in the sealing area SA, and may extend in the third direction D3 in the second peripheral area PA2. The second extension pattern FL4*b* of the fourth fan-out line FL4 may partially overlap the second extension pattern FL3*b* of the third fan-out line FL3 in the second peripheral area PA2.

In an embodiment, an area where fan-out lines may be disposed may be expanded in the second peripheral area PA2 between the sealing area SA and the pad part, as illustrated in FIG. 14. Thus, a space for spacing adjacent fan-out lines in the sealing area SA may be easily prepared.

The above embodiments provide an organic-light emitting display device. However, embodiments are not limited thereto. For example, embodiments may be applied for display devices such as a liquid crystal display device, a electroluminescent display device, a micro LED display device or the like.

Embodiments may be applied to various display devices. For example, an embodiment may be applied to a vehicle-display device, a ship-display device, an aircraft-display device, portable communication devices, display devices for display or for information transfer, a medical-display device, etc.

The foregoing is illustrative of embodiments and is not to be construed as limiting thereof. Although embodiments have been described, those skilled in the art will readily appreciate that many modifications are possible in the embodiments without materially departing from the novel teachings and aspects of the inventive concept. Accordingly, all such modifications are intended to be included within the scope of the inventive concept. Therefore, it is to be understood that the foregoing is illustrative of various embodiments and is not to be construed as limited to the specific embodiments disclosed, and that modifications to the disclosed embodiments, as well as other embodiments, are intended to be included within the scope of the inventive concept, as set forth in the following claims and equivalents thereof.

What is claimed is:

1. A display device comprising:
   an array substrate including:
      a pixel array disposed in a display area; and
      a fan-out wiring disposed in a peripheral area adjacent to the display area, the fan-out wiring being disposed in a sealing area surrounding the display area; and
   a cover substrate combined with the array substrate by a sealing member disposed in the sealing area, wherein
   the fan-out wiring includes a first fan-out line, a second fan-out line and a third fan-out line, which are disposed in different layers in a first peripheral area between the display area and the sealing area, and
   the first fan-out line and the second fan-out line are disposed in a same layer in the sealing area, and the first fan-out line and the third fan-out line are disposed in different layers in the sealing area.

2. The display device of claim 1, wherein the second fan-out line is disposed between the first fan-out line and the third fan-out line in the sealing area.

3. The display device of claim 1, wherein the first fan-out line includes:
   a first extension pattern disposed in the first peripheral area and the sealing area; and
   a second extension pattern disposed in a second peripheral area spaced apart from the first peripheral area by the sealing area and electrically connected to the first extension pattern, the first extension pattern and the second extension pattern being disposed in different layers.

4. The display device of claim 3, wherein the second fan-out line includes:
   a first extension pattern disposed in the first peripheral area; and
   a second extension pattern disposed in the sealing area and the second peripheral area and electrically connected to the first extension pattern of the second fan-out line, the first extension pattern and the second extension pattern of the second fan-out line being disposed in different layers.

5. The display device of claim 4, wherein the third fan-out line includes:
   a first extension pattern disposed in the first peripheral area; and
   a second extension pattern disposed in the sealing area and the second peripheral area and electrically connected to the first extension pattern of the third fan-out line, the first extension pattern and the second extension pattern of the third fan-out line being disposed in different layers.

6. The display device of claim 5, wherein the second extension pattern of the first fan-out line, the second extension pattern of the third fan-out line, and the first extension pattern of the second fan-out line are disposed in a same layer.

7. The display device of claim 6, wherein the pixel array includes:
   a first gate metal pattern including a gate electrode;
   a second gate metal pattern including a capacitor electrode pattern; and
   a first source metal pattern including a source electrode and a drain electrode, wherein
   the first extension pattern of the first fan-out line and the first gate metal pattern are disposed in a same layer,
   the first extension pattern of the second fan-out line and the first source metal pattern are disposed in a same layer, and
   the first extension pattern of the third fan-out line and the second gate metal pattern are disposed in a same layer.

8. The display device of claim 5, wherein the fan-out wiring further includes a fourth fan-out line, the fourth fan-out line including:
   a first extension pattern disposed in the first peripheral area; and
   a second extension pattern disposed in the sealing area and the second peripheral area and electrically connected to the first extension pattern of the fourth fan-out line, the first extension pattern and the second extension pattern of the fourth fan-out line being disposed in different layers.

9. The display device of claim 8, wherein
   the second extension pattern of the second fan-out line and the first extension pattern of the first fan-out line are disposed in a same layer, and
   the second extension pattern of the fourth fan-out line and the first extension pattern of the third fan-out line are disposed in a same layer.

10. The display device of claim 5, wherein the second extension pattern of the second fan-out line includes a material having a melting point higher than a melting point of the first extension pattern of the second fan-out line.

11. The display device of claim 1, wherein the first to third fan-out lines include a conductive material having a melting point equal to or more than about 1,200° C., in the sealing area.

12. The display device of claim 1, wherein the first to third fan-out lines include molybdenum in the sealing area.

13. The display device of claim 1, wherein adjacent fan-out lines overlap each other in the first peripheral area, in a plan view.

14. The display device of claim 13, wherein adjacent fan-out lines are spaced apart from each other in the sealing area, in a plan view.

15. The display device of claim 14, wherein the fan-out lines are spaced apart from each other in a first direction in the sealing area, extend in a second direction perpendicular to the first direction in the sealing area, and extend in a third direction crossing the first direction and the second direction in the first peripheral area.

16. The display device of claim 15, wherein adjacent fan-out lines overlap each other in a second peripheral area spaced apart from the first peripheral area by the sealing area, in a plan view.

17. The display device of claim 16, wherein the fan-out lines extend in the third direction in the second peripheral area.

18. The display device of claim 1, wherein the array substrate further includes a power bus line overlapping the first to third fan-out lines in the first peripheral area.

19. The display device of claim 18, wherein
the array substrate further includes a power transfer line electrically connected to the power bus line, and
the power transfer line and one of the first fan-out line and the second fan-out line are disposed in a same layer in the sealing area.

20. A display device comprising:
a pixel array disposed in a display area; and
a fan-out wiring disposed in a peripheral area adjacent to the display area and including fan-out lines, wherein each of the fan-out lines includes:
a first extension pattern disposed in a first peripheral area; and
a second extension pattern disposed in a second peripheral area and electrically connected to the first extension pattern, the first extension pattern and the second extension pattern being disposed in different layers,
a first extension pattern of a first fan-out line and a first extension pattern of a second fan-out line adjacent to the first fan-out line are disposed in different layers, and
a first extension pattern of a third fan-out line adjacent to the second fan-out line, the first extension pattern of the first fan-out line, and the first extension pattern of the second fan-out line are disposed in different layers.

21. The display device of claim 20, wherein the pixel array includes:
a first gate metal pattern including a gate electrode;
a second gate metal pattern including a capacitor electrode pattern; and
a first source metal pattern including a source electrode and a drain electrode, wherein
the first extension pattern of the first fan-out line and the first gate metal pattern are disposed in a same layer,
the first extension pattern of the second fan-out line and the first source metal pattern are disposed in a same layer, and
the first extension pattern of the third fan-out line and the second gate metal pattern are disposed in a same layer.

22. The display device of claim 20, wherein adjacent fan-out lines overlap each other in the first peripheral area, in a plan view.

23. The display device of claim 22, wherein adjacent fan-out lines overlap each other in the second peripheral area, in a plan view.

24. The display device of claim 20, wherein the first extension pattern of the first fan-out line, the second extension pattern of the second fan-out line, and the first extension pattern of the third fan-out line extend into a sealing area between the first peripheral area and the second peripheral area, and include a conductive material having a melting point equal to or more than about 1,200° C.

25. The display device of claim 20, wherein the first extension pattern of the first fan-out line, the second extension pattern of the second fan-out line, and the first extension pattern of the third fan-out line extend into a sealing area between the first peripheral area and the second peripheral area, and include molybdenum.

* * * * *